United States Patent
Fujimoto (10) Patent No.: US 7,601,920 B2
(45) Date of Patent: Oct. 13, 2009

(54) SURFACE MOUNT COMPOSITE ELECTRONIC COMPONENT AND METHOD FOR MANUFACTURING SAME

(75) Inventor: Koji Fujimoto, Nagano (JP)

(73) Assignee: KOA Corporation, Nagano (JP)

( * ) Notice: Subject to any disclaimer, the term of this patent is extended or adjusted under 35 U.S.C. 154(b) by 447 days.

(21) Appl. No.: 10/579,680

(22) PCT Filed: Nov. 12, 2004

(86) PCT No.: PCT/JP2004/016828

§ 371 (c)(1),
(2), (4) Date: May 17, 2006

(87) PCT Pub. No.: WO2005/050677

PCT Pub. Date: Jun. 2, 2005

(65) Prior Publication Data

US 2007/0096864 A1    May 3, 2007

(30) Foreign Application Priority Data

Nov. 18, 2003   (JP) ............................. 2003-387948

(51) Int. Cl.
*H05K 1/02*   (2006.01)
(52) U.S. Cl. ..................... 174/259; 361/752; 361/760
(58) Field of Classification Search ................ 174/259; 338/320; 361/752, 760
See application file for complete search history.

(56) References Cited

U.S. PATENT DOCUMENTS

| | | | |
|---|---|---|---|
| 6,097,277 A * | 8/2000 | Ginn et al. | 338/320 |
| 6,597,276 B1 * | 7/2003 | Chiang et al. | 338/22 R |
| 6,897,761 B2 * | 5/2005 | Ernsberger et al. | 338/309 |
| 7,269,025 B2 * | 9/2007 | David | 361/760 |
| 7,342,804 B2 * | 3/2008 | Langhorn et al. | 361/766 |
| 2004/0090759 A1 * | 5/2004 | Kim | 361/790 |
| 2005/0168960 A1 * | 8/2005 | Asahi et al. | 361/761 |

FOREIGN PATENT DOCUMENTS

| | | |
|---|---|---|
| JP | 04-165602 | 6/1992 |
| JP | 09-260113 | 10/1997 |
| JP | 10-125503 | 5/1998 |
| JP | 2001-143903 | 5/2001 |
| JP | 2001-167902 | 6/2001 |
| JP | 2003-015309 | 1/2003 |
| JP | 2003-068502 | 3/2003 |

* cited by examiner

*Primary Examiner*—Dean A. Reichard
*Assistant Examiner*—Andargie M Aychillhum
(74) *Attorney, Agent, or Firm*—Mark Montague; Cowan, Liebowitz & Latman, P.C.

(57) ABSTRACT

The present invention provides a surface mount composite electronic component which can be made compact. The structure of the surface mount composite electronic component is one in which a circuit element is formed on each of a set of opposing surfaces of an insulating substrate composed of a hexahedron, with electrodes that make up the circuit elements also functioning as external terminals. For example, a pair of first electrodes disposed on both ends of a front surface of the insulating substrate composed of a hexahedron, a pair of second electrodes disposed on a rear surface of the insulating substrate opposite the first electrodes, a first resistor disposed so as to contact both of the first pair of electrodes, and a second resistor disposed so as to contact both of the second electrodes.

14 Claims, 8 Drawing Sheets

SURFACE MOUNT COMPOSITE ELECTRONIC COMPONENT AND METHOD FOR MANUFACTURING SAME

BACKGROUND OF THE INVENTION

1. Field of the Invention

The present invention relates to a surface mount composite electronic component and method for manufacturing same

2. Background of the Invention

An example of the typical external form of a surface mount composite electronic component is disclosed in Japanese Patent Application Publication No. 2001-015309, in which the ceramic substrate external form is in the shape of an H, with two resistance elements (circuit elements) formed on one surface thereof. In addition, an electronic component in which resistance elements are formed on lateral side surfaces of the substrate is disclosed in U.S. Pat. No. 6,097,277.

However, as the demand for compactness in electronic components increases, the structure of the conventional electronic component described above is becoming inadequate to such demand. Due to the complexity of the shape of the H-shaped ceramic substrate described above, the contraction of the substrate during ceramic baking greatly affects the dimensions of the substrate. Consequently, it is difficult to make such dimensions consistently uniform. In addition, with an electronic component in which resistance elements are formed on lateral side surfaces of the substrate disclosed above, because electrically conductive balls are used as the external terminals of the circuit elements, the entire structure becomes complicated and is unsuitable for making the electronic component compact.

SUMMARY OF THE INVENTION

Accordingly, the present invention has as an object to provide a surface mount composite electronic component which can be made compact.

To achieve the above-described object, the present invention provides a surface mount composite electronic component in which a circuit element 2 is formed on each surface of a pair of opposed surfaces of an insulating substrate 1 composed of a hexahedron, wherein electrodes 3 that make up the circuit element 2 also function as external terminals.

The above-described "hexahedron" includes a rectangular solid in which each of three sets of opposing surfaces are of different shapes like that shown in FIG. 1A, a cube, and a rectangular solid in which two sets of opposing surfaces have the same shape and the remaining set of opposing surfaces is of a different shape. It should be noted that, even if there are other surfaces which are formed by the presence of dividing grooves 9 formed on edge portions of the "hexahedron" like that shown in FIG. 9B described below, anything whose external form can broadly be called "hexahedral" is here a "hexahedron". In addition, the above-described "circuit element 2" includes resistance elements, condenser elements, inductor elements, conductor elements, and so-called CR composite electronic components and the like. The aforementioned conductor elements have applications as so-called jumper components. In addition, because the "circuit element 2 is formed on each surface of a pair of opposed surfaces of an insulating substrate composed of a hexahedron," the circuit element 2 can comprise two or more composite electronic components. Here, "external terminals" means members that directly electrically connect to the lands of a circuit board 14 by solder or the like.

Figure 1:
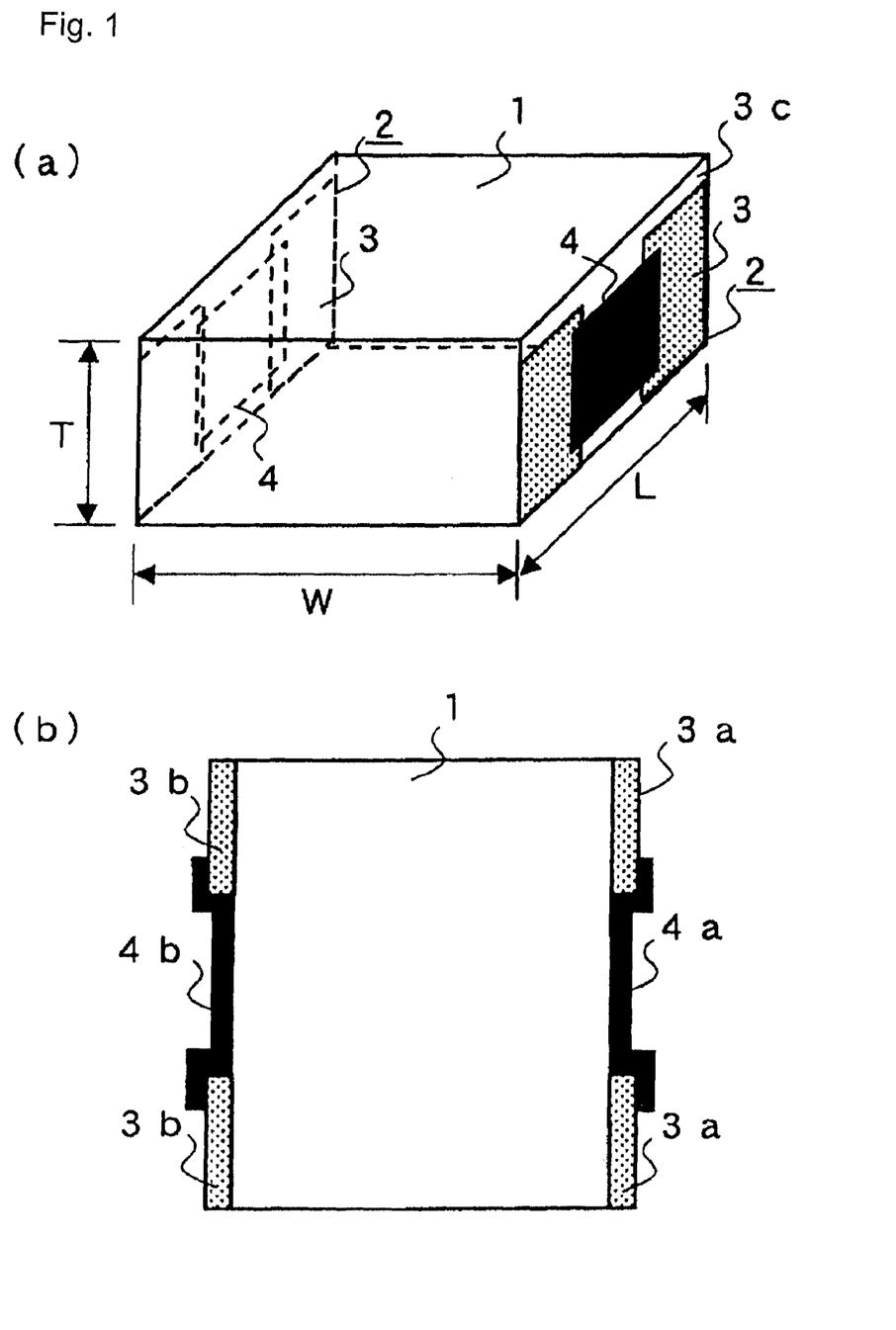

The surface mount composite electronic component of the present invention shown in FIG. 1 is a surface mount composite electronic component in which each circuit element 2 is formed on each surface of a set of opposing surfaces of an insulating substrate 1 composed of a hexahedron, wherein electrodes 3 that make up the circuit element 2 also function as external terminals, forming a so-called surface mount 2-chip type electronic component.

Figure 8:
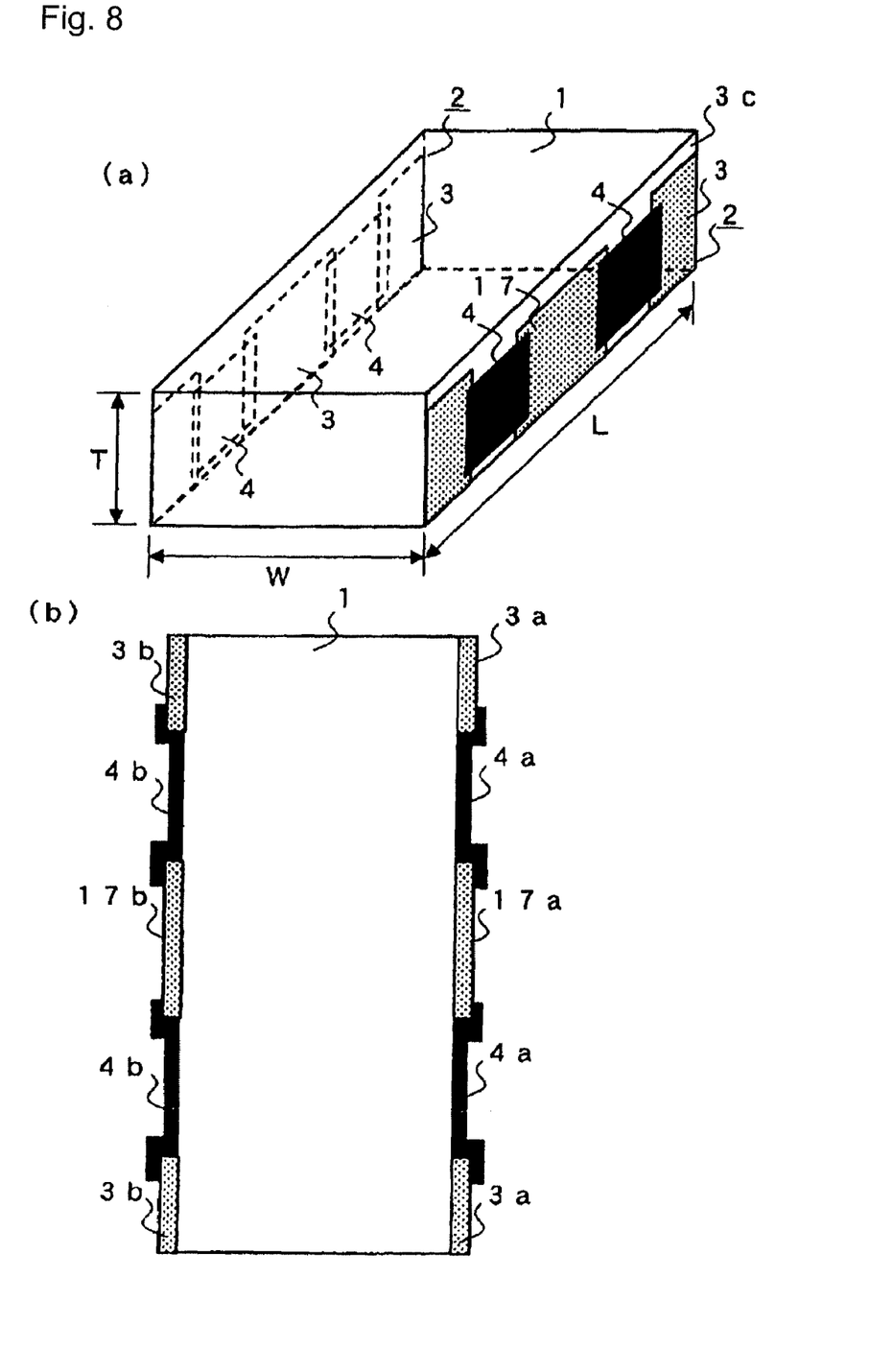

In addition, the surface mount composite electronic component of the present invention shown in FIG. 8 is a surface mount composite electronic component in which circuit elements 2 (two circuit elements 2 in FIG. 8) are formed on each surface of a set of opposing surfaces of an insulating substrate 1 composed of a hexahedron, wherein the circuit elements 2 are arranged in a direction parallel to a mount surface through electrodes 3 that make up the circuit elements 2 and which also function as external terminals, forming a so-called surface mount 4-chip type electronic component. It goes without saying that three or more circuit elements 2 may be disposed on each of the sets of opposing surfaces of the insulating substrate 1 composed of a hexahedron, forming, for example, so-called 8-chip type electronic components and 16-chip type electronic components.

The surface mount composite electronic component of the present invention uses an insulating substrate 1 composed of a hexahedron, and thus the overall shape is not complicated compared to the conventional H-shaped ceramic substrate. In addition, since the electrodes 3 make up the circuit elements 2 also function as external terminals, the number of structural members can be reduced and the structure remains uncomplicated. Therefore, the surface mount composite electronic component of the present invention can be made compact, solving the problem described above.

Particularly with the surface mount 4-chip type electronic component shown in FIG. 8 (a surface mount composite electronic component in which the number of external terminals of the 4-chip resistors is six), or the surface mount composite electronic component of the present invention composed of an equal or greater number of multiple circuit elements 2, the number of external terminals can be reduced. For example, that the 4-chip resistor usually requires eight conventional external terminals is well known. However, with the 4-chip resistor shown in FIG. 8, because the shared electrodes 17 contact the resistors 4 also function as external terminals, six external terminals suffice. Consequently, compared to the compactness of the 2-chip resistor shown in FIG. 1, the degree of compactness achieved with the 4-chip resistor shown in FIG. 8 is incomparably greater. In addition, by reducing the number of external terminals, for example, there is the other advantage of reducing the burden of scanning the condition of the solder fillets after the electronic component is mounted. Furthermore, there is also the advantage of being able to reduce the amount of solder used in mounting. Here, it goes without saying that the above-described problem that the invention attempts to solve is also solved by separating the shared electrodes 17 in the 4-chip resistor shown in FIG. 8 and creating eight external terminals as in the conventional art.

The aforementioned "compactness" described above means, for example, that the long side of the one surface of the insulating substrate 1 on which the circuit element 2 is formed is 1.0 mm or less. In case of this sort of "compact" surface mount composite electronic component, the present invention makes it possible to obtain particularly advantageous effects.

Figure 2:
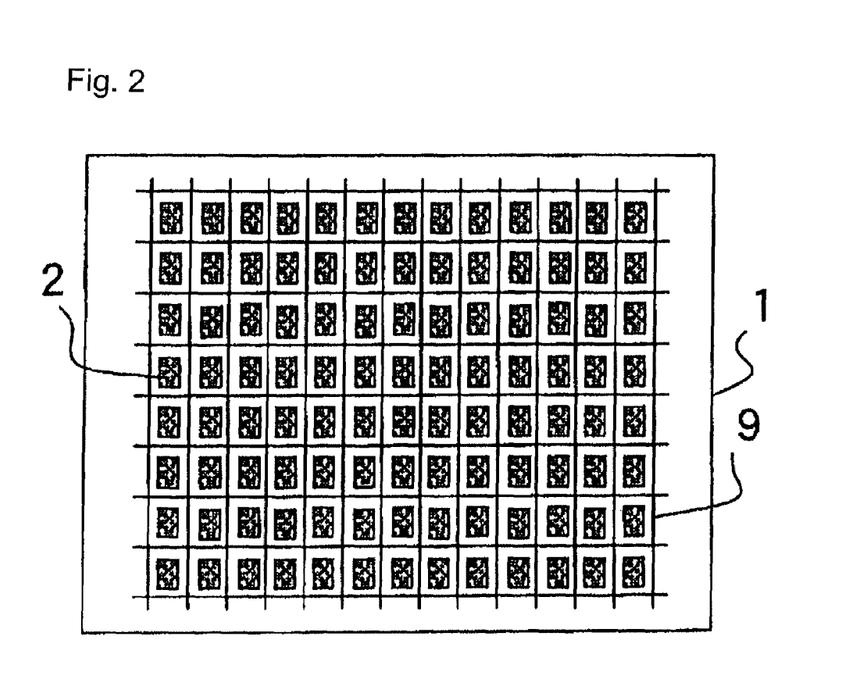
FIG. 2 shows a state in which multiple circuit elements are formed on a large insulating substrate surface according to the surface mount composite electronic component of the present invention.

With the conventional H-shaped ceramic substrate, when extracting multiple so-called 1005-size composite electronic components (in which the substrate 1 used in the unit circuit elements measures 1.0 mm×0.5 mm), it is not possible to extract H-shaped ceramic substrates across the entire surface of a large-scale insulating substrate 1 of approximately 50 mm square (for example, as shown in FIG. 2). The reason is that the rate of contraction during ceramic baking is different at the center and at the edges of the large-scale insulating substrate 1 due to the presence of holes provided in the large-scale insulating substrate 1 for the purpose of making the H shape, and it is very difficult to obtain H-shaped ceramic substrates of consistent dimensions from the entire surface of the single large-scale insulating substrate 1. Therefore, wasted unused areas exist at the periphery of the large-scale insulating substrate 1. Accordingly, with so-called 1608-size (in which the substrate 1 used in the unit circuit element measures 1.6 mm×0.8 mm) or greater H-shaped ceramic substrates, H-shaped ceramic substrates of substantially consistent dimensions can be extracted across the entire surface of a large-scale insulating substrate 1 of approximately 50 mm square.

Therefore, with composite electronic components in which the long side of the surface of the insulating substrate 1 on which the circuit element 2 is formed is 1.0 mm or less, which is the equivalent of the so-called 1005 size electronic component, or even smaller 0603-size (in which the substrate 1 used in the unit circuit elements measures 0.6 mm×0.3 mm) or 0402-size (in which the substrate 1 used in the unit circuit elements measures 0.4 mm×0.2 mm) electronic components, there are particularly advantageous effects which can be obtained in terms of mass production, and is optimal. The present invention uses not an H-shaped but a hexahedron insulating substrate 1, and thus the amount and rate of contraction during baking of the large-scale insulating substrate 1 is substantially uniform.

Even with a surface mount composite electronic component of the present invention in which the length of the long side of the surface of the insulating substrate 1 on which the circuit elements 2 are formed is greater than 1.0 mm, it goes without saying that, because the number of structural elements can be reduced and the structure as a whole is not complicated, it has the effect of contributing to making the electronic component compact, and for that reason the problem described above can be solved.

Figure 5:
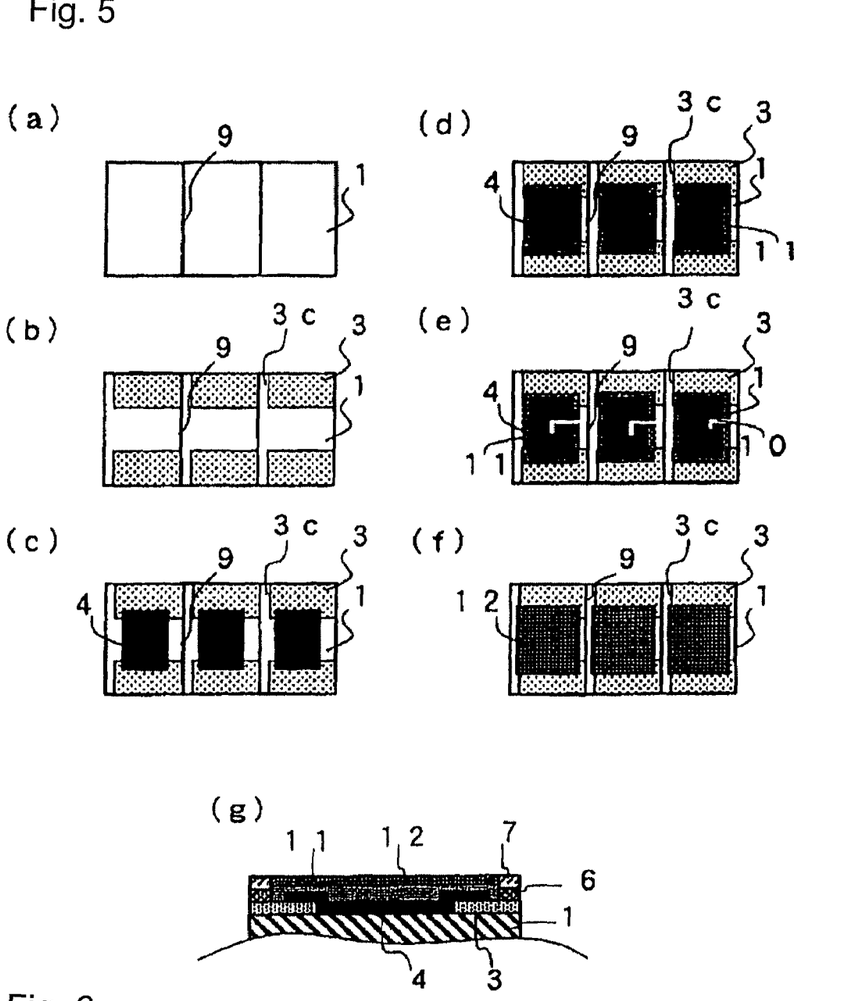
FIG. 5 is a diagram showing steps in a process of manufacturing the surface mount composite electronic component of the present invention, in the present embodiment of the present invention.

The surface mount composite electronic component of the present invention is one in which, for example, the circuit elements 2 is composed of a pair of electrodes 3 as well as a resistor 4 or a dielectric 5 that contacts both electrodes 3, with a nickel plate layer 6 and a solder plate layer 7 laid down, in that order, on front surfaces of external terminal areas of the electrodes 3 (for example, FIG. 5G).

The above-described solder plate layer 7 improves liquidity of solder when mounting the electrodes 3 of the circuit element 2 and electrically connecting the electrodes 3 to the lands of the circuit board as external terminals by solder. The above nickel plate layer 6 is to prevent the lacking of the electrodes 3 that is formed by soldering. In addition, if that which "contacts both electrodes 3" is the resistor 4, the circuit element 2 becomes a resistance element, and if that which "contacts both electrodes 3" is the dielectric 5, the circuit element 2 becomes a condenser element.

A specific example of a case in which the circuit element 2 of the surface mount composite electronic component of the present invention is a resistance element is shown in FIG. 1B which is a plan view of FIG. 1A. This is a surface mount composite electronic component comprising a pair of first electrodes 3a disposed on both ends of a front surface of an insulating substrate 1 composed of a hexahedron, a pair of second electrodes 3b disposed on a rear surface of the insulating substrate 1 opposite the first electrodes 3a, a first resistor 4a disposed so as to contact both of the first pair of electrodes 3a, and a second resistor 4b disposed so as to contact both of the second electrodes 3b.

Furthermore, another specific example of a case in which the circuit element 2 of the surface mount composite electronic component of the present invention is a resistance element is shown in FIG. 8B which is a plan view of FIG. 8A. This is a surface mount 4-chip type electronic component comprising a pair of first electrodes 3a disposed on both ends of a front surface of an insulating substrate 1 composed of a hexahedron and a first shared electrode 17a disposed between and separate from said first electrodes 3a, a pair of second electrodes 3b disposed on a rear surface of the insulating substrate 1 opposite the first electrodes 3a and a second shared electrode 17a disposed between and separate from said second electrodes 3b, two first resistors 4a disposed so as to contact the first electrodes 3a and the first shared electrode 17a, and two second resistors 4b disposed so as to contact the second pair of electrodes 3b and the second shared electrode 17b.

An example of a method of manufacturing the surface mount composite electronic component of the present invention comprises a step of forming predetermined circuit elements 2 on both side surfaces of an insulating substrate 1 of divisional units of a large-scale insulating substrate 1 demarcated latitudinally and longitudinally on both side surfaces thereof at opposing locations; and a step of dividing the large-scale insulating substrate 1 into said divisional units, a composite electronic component composed of circuit elements 2 on both side surfaces of the insulating substrate 1 being formed by these steps, one of the surfaces of the insulating substrate 1 other than the both side surfaces of the insulating substrate 1 being a surface facing a circuit board 14.

In addition, the surface mount composite electronic component of the present invention shown in FIG. 1 and FIG. 8 has one surface of the insulating substrate 1 that is substantially perpendicular to an adjacent surface. This is a shape that permits maximum compactness of the electronic component in the hexahedron obtained by the substrate that has same surface area as that of the substrate 1.

Figure 3:
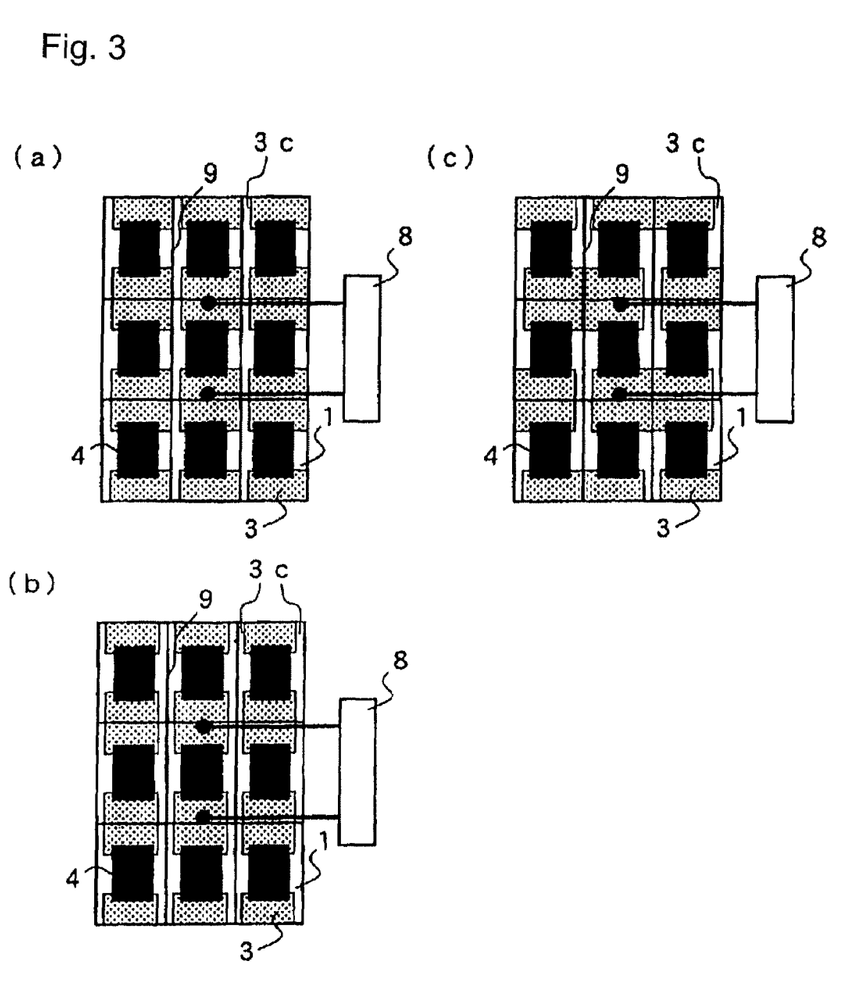

In addition, the surface mount composite electronic component shown in FIG. 1 and FIG. 8 has regions 3c in which no electrodes 3 are present on an edge portion of the surface of the insulating substrate 1 on which said external terminals are present, disposed perpendicular to a straight line connecting a pair of external terminals electrically connected to one circuit element 2. This is intended to facilitate mass production. In other words, when attempting to obtain multiple surface mount composite electronic components according to the present invention from the large-scale insulating substrate 1, multiple circuit elements 2 are formed on the surface of the large-scale insulating substrate 1 as shown in FIG. 2. Then, typically, the large-scale insulating substrate 1 is divided to obtain individual electronic components. At this time, it is convenient to scan, grasp and/or adjust the characteristic of the individual circuit elements 2 in a state in which multiple circuit elements 2 are formed on the surface of the large-scale insulating substrate 1. This is because the circuit elements 2 are aligned at equal intervals, facilitating probing using a probe jig 8 (FIG. 3). When probing, shorting adjacent circuit elements 2 is not permitted. That the surface mount composite electronic component have regions 3c in which no electrodes are present on both end portions of the surface of the insulating substrate 1 perpendicular to the direction of flow of the electric current in the circuit elements 2 is to aid in preventing such short-circuiting.

Particular where the circuit elements 2 are resistance elements, it is usual to adjust the value of the resistance (called "trimming") while probing using the probe jig 8 as described above. Therefore, as shown in FIG. 3, preferably, the electrodes 1 have regions 3c in which no electrodes are present on one or both end portions of the surface of the insulating substrate 1 perpendicular to the direction of flow of the electric current in the circuit elements 2. FIG. 3 shows probing of the resistance element in the center.

FIG. 3C shows the electrodes 3 of a surface area approximately twice that of FIGS. 3A, 3B arranged in zigzag pattern. By being able to approximately double the surface area of the electrodes 3, it is possible to improve the consistency/reliability of the shape of the electrodes 3. Particularly in the case of forming the electrodes 3 with a thick-film formation method such as screen printing and the like, the dimensional accuracy of the formed product is inferior to that achieved with such thin-film formation methods as sputtering and the like, and for this reason the embodiment shown in FIG. 3C affords a very advantageous effect. On the other hand, where electrodes 3 and resistors 4 are disposed as shown in FIG. 3C, when attempting to measure the resistance value of one resistance element, the resistance values of the other plurality of resistance elements might be measured as well. In such cases, as necessary, a probe pin is contacted against the electrodes 3 of the resistance element to be measured, while at the same time probe pins are contacted against the other electrodes 3 as well and a voltage applied to prevent the current from circulating.

Figure 4:
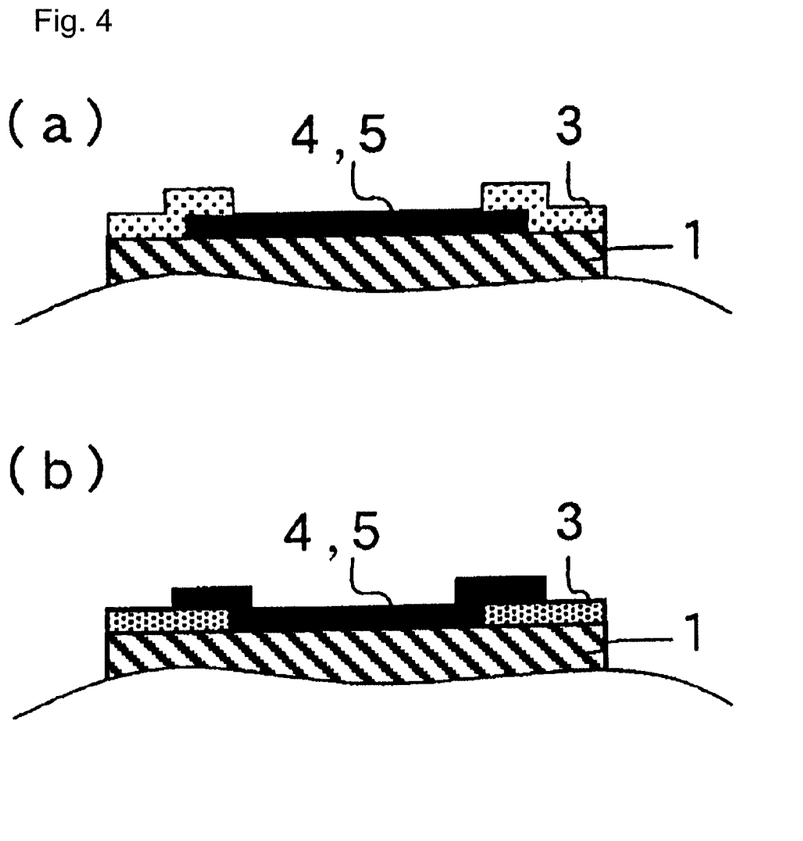

In addition, where the circuit element 2 of the surface mount composite electronic component of the present invention is a resistance element or a condenser element, preferably, the surface mount composite electronic component has an area in which the electrodes 3 and the resistor 4 or the dielectric 5 overlap and contact each other on top of the insulating substrate, the resistor 4 or the dielectric 5 disposed atop the insulating substrate 1 in said area, and further, the electrodes 3 laid atop the resistor 4 or the dielectric 5 (FIG. 4A).

The reason therefor is that, if the positions of the resistor 4 and the electrodes 3 are reversed (FIG. 4B), the areas where they overlap cannot be utilized as external terminals, whereas with the arrangement of the resistor 4 and the electrodes 3 shown in FIG. 4A there is the advantage that the areas of overlap can be utilized as external terminals. Insofar as the problem of the relative shares of the surface of the insulating substrate 1 of the members that compose the circuit element 2 increases as the electronic components become more compact, the ability to make effective practical use of such areas of overlap is advantageous.

In addition, by arranging the resistor 4 and the electrodes 3 in the positions shown in FIG. 4A, the formation surface area of the resistor 4 where the same external terminal surface area is secured can be increased compared to the arrangement shown in FIG. 4B. When the formation surface area of the resistor 4 is small, the effect of the presence or absence of even small portions of the resistor 4, in other words of inconsistencies in the shape of the resistor 4, on the resistance value of the resistance element as a whole is great, and therefore the ability to increase the surface area of the resistor 4 is advantageous. Particularly in the case of forming the resistor 4 by a thick-film formation method such as screen printing and the like, the dimensional accuracy of the formed product is inferior to that achieved with such thin-film formation methods as sputtering and the like, and for this reason the embodiment shown in FIG. 4A affords a very advantageous effect.

Figure 7:
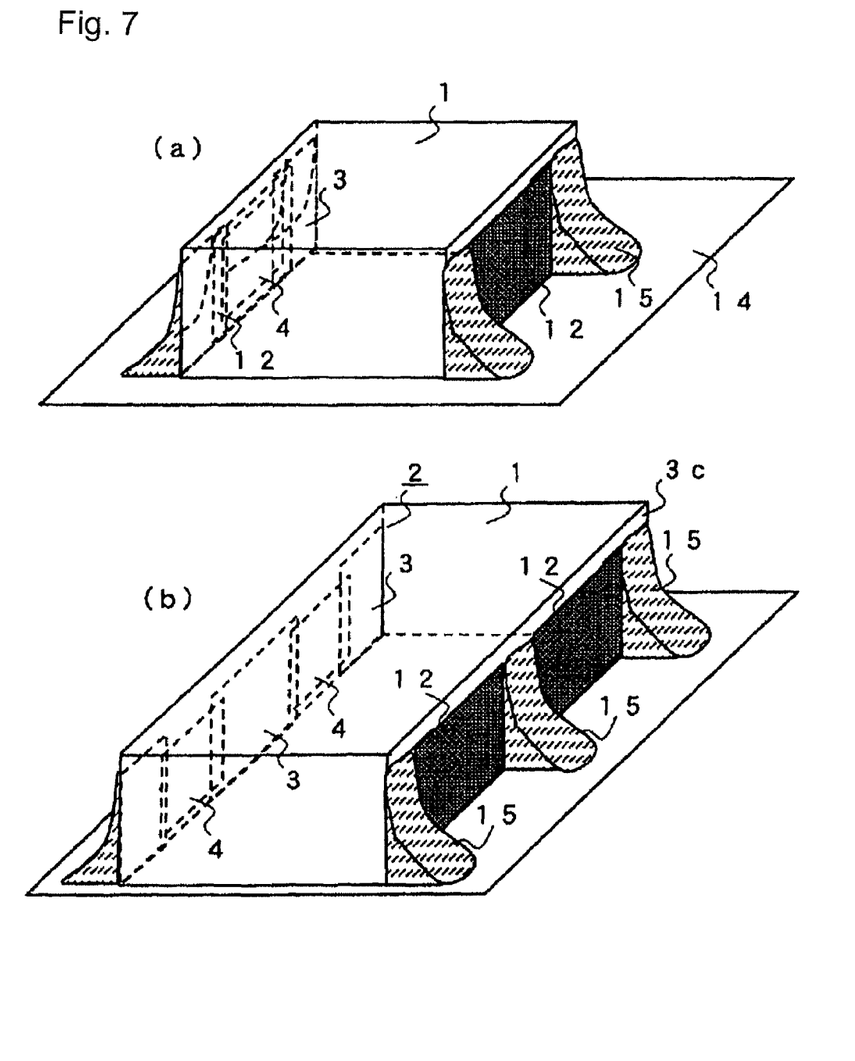
FIG. 7 shows an external view of a mount surface-mounted on a circuit board of the surface mount composite electronic component of the present invention.

In addition, in the surface mount composite electronic component of the present invention described above and in preferred embodiments based thereon, preferably, a relation between an insulating substrate dimension (L) in a direction of flow of electric current of the circuit element of the insulating substrate surface on which circuit elements are formed, an insulating substrate dimension (T) perpendicular to L, and a distance (W) between surfaces of the insulating substrate on which the circuit elements are formed is $L \geqq W > T$. This, for example, is the structure of the surface mount composite electronic component shown in FIG. 1 and in FIG. 8. With such a structure, the most stable mounting condition is achieved when the surface mount composite electronic component is mounted on the surface of the circuit board 14 in a state in which two circuit elements 2 are on lateral side surfaces of the insulating substrate 1 (FIG. 7), because the bottom surface and the top surface of the surface mount composite electronic component of the present invention have the largest surface areas of all the surfaces of the insulating substrate 1, and the reliability of the state of the mounting of the surface mount electronic component is improved.

Furthermore, in the surface mount composite electronic component of the present invention described above and in preferred embodiments based thereon, preferably, a surface of the insulating substrate 1 facing a circuit board 14 is smooth. Particularly in the case of a compact surface mount composite electronic component, if the surface of the insulating substrate 1 that faces the circuit board 14 is uneven, the state of the mounting of the electronic component on the circuit board 14 is unstable. As a result, when undertaking a reflow step, which is a typical step of fixedly mounting a surface mount electronic component on a circuit board 14, there is a risk of a tombstone effect occurring caused by the aforementioned unevenness. Accordingly, it is preferable that the surface of the insulating substrate 1 that faces the circuit board 14 be as smooth as possible. The smoothness of a cut surface like that obtained by cutting a ceramic insulating substrate 1 by dicing is sufficient.

Accordingly, to achieve the smoothness described above, an example of a method of manufacturing the surface mount composite electronic component of the present invention comprises a step of forming predetermined circuit elements 2 on both side surfaces of an insulating substrate 1 of divisional units of a large-scale insulating substrate 1 demarcated latitudinally and longitudinally on both side surfaces thereof at opposing locations; and a step of dividing the large-scale insulating substrate 1 into said divisional units, a composite electronic component composed of circuit elements 2 on both side surfaces of the insulating substrate 1 being formed by these steps, the surfaces of the insulating substrate 1 other than the both side surfaces of the insulating substrate 1 facing a circuit board 14 are formed by dicing.

Furthermore, in the surface mount composite electronic component of the present invention described above and in preferred embodiments based thereon, preferably, the electrodes 3 that also function as external terminals are also present on a surface of the insulating substrate 1 adjacent to the surface of the insulating substrate 1 on which the circuit elements 2 are present. The first reason for this is that, assuming a case in which a plating step of forming layers of Ni or soldering and the like on the surfaces of the electrodes 3 of the surface mount composite electronic component of the present invention by barrel plating is undertaken, the probability of contacting dummy balls increases and the easiness of facilitating the aforementioned layer formation increases. For a high probability of dummy ball contact, it is very important that the electronic component be of a shape that achieves an electrical connection between a single electrode 3 and both dummy balls while the electrode 3 is being inserted between the dummy balls. The electrodes 3 are also present on a surface of the insulating substrate 1 adjacent to the surface of the insulating substrate 1 on which the circuit elements are present, and therefore the electronic component becomes the aforementioned shape. It should be noted that the "adjacent surface of the insulating substrate 1" includes a surface like that formed on edge portions of the hexahedron by the presence of dividing grooves 9 as shown in FIG. 9B discussed later.

The second reason is that the strength of the mounting of the surface mount composite electronic component on the circuit board 14 can be increased. The electrodes 3 that also function as external terminals are also present on a surface of the insulating substrate 1 adjacent to the surface of the insulating substrate 1 on which the circuit elements 2 are present, and therefore the directions in which the external terminals that are affixed to the circuit board 14 fixedly mount and support the electronic component diverge into many branches. Accordingly, a mounting state can be achieved that is capable of withstanding impact and stress on the mounted electronic component from many directions. Here, the strength of the mounting of the surface mount electronic component on the circuit board 14 can be strengthened also in a case in which the electrodes 3 are formed without passing through surfaces formed on the hexahedron by the presence of the dividing grooves 9, and further, on adjacent surfaces of the insulating substrate 1.

Figure 9:
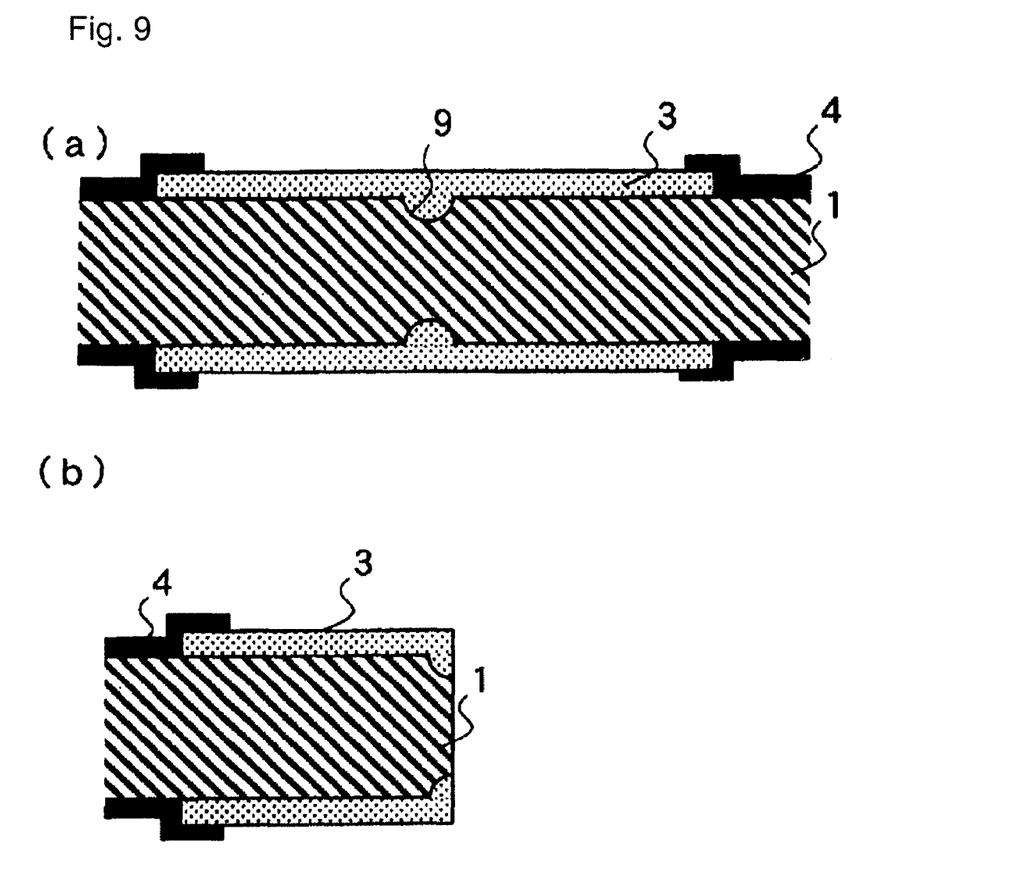

An example of means for arranging matters so that the electrodes 3 that also function as external terminals are also present on a surface of the insulating substrate 1 adjacent to the surface of the insulating substrate 1 on which the circuit elements 2 are present is shown in FIG. 9. FIG. 9A shows a state in which dividing grooves 9 are present on both side surfaces of the insulating substrate 1 and the electrodes 3 are disposed so as to straddle those dividing grooves 9. FIG. 9B shows a state in which the insulating substrate 1 is divided along the above-described grooves 9 by dicing or other such means. Here, the electrodes 3 present inside the grooves 9 remains after division. These remaining electrodes 3 become electrodes 3 that are present as well on a surface of the insulating substrate 1 that is adjacent to the surfaces of the insulating substrate 1 on which the circuit elements 2 are present.

Another example of means for arranging matters so that the electrodes 3 that also function as external terminals are also present on a surface of the insulating substrate 1 adjacent to the surface of the insulating substrate 1 on which the circuit elements 2 are present is a means that forms the electrodes 3 on the above-described adjacent surface of the insulating substrate 1 by a printing method such as screen printing, by thin-film technology such as sputtering, or by coating technology or the like. These "other means" are advantageous as means for forming the electrodes 3 on a surface that forms one surface of the hexahedron other than surfaces, particularly as shown in FIG. 9B described below, formed on edge portions of the hexahedron by the presence of the dividing grooves 9.

The present invention makes it possible to provide a surface mount composite electronic component which can be made compact.

BRIEF DESCRIPTION OF THE DRAWINGS

FIG. 1A is a perspective view of an example of a surface mount composite electronic component which can be made compact, and 1B is a plan view of 1A;

FIG. 3 are diagrams showing states in which electrodes according to the surface mount composite electronic component of the present invention have regions in which no electrodes are present on 3A one end and 3B both ends of an insulating substrate surface perpendicular to the direction of flow of the electric current in the circuit elements;

FIG. 4A is a diagram showing a state in which a resistor overlays the insulating substrate, and further, electrodes overlay the resistor, and 4B shows a state in which the positions of the resistor and the electrodes are reversed;

FIG. 8A is a perspective view of an example of the surface mount composite electronic component of the present invention, and 8B is a plan view of 8A; and FIG. 9A is a sectional view of an example of a state in which surface mount composite electronic components of the present invention are connected by a groove used for separation, and 9B is a sectional view of an example of a state in which the components are divided along the groove shown in 9A.

DETAILED DESCRIPTION OF THE PREFERRED EMBODIMENTS

A description will now be given of a method for manufacturing a surface mount composite electronic component of the present invention, with reference to the accompanying drawings. It should be noted that FIGS. 5A-5F show only three unit electronic components in a large-scale insulating substrate 1.

First, latitudinal and longitudinal horizontal grooves 9 are formed at corresponding (opposing) positions at top and bottom surfaces, and an alumina ceramic large-scale substrate 1 having a thickness of 0.5 mm-thick (FIGS. 2, 5A) is prepared for a division (measuring 0.3 mm×0.6 mm) demarcated by such grooves 9 that will become a unit electronic component. Next, a metal glaze-type AG—Pd electrode paste is printed/baked onto one surface of the large-scale insulation substrate 1 at predetermined positions by a screen printing method and electrodes 3 obtained (FIG. 5B). Electrodes 3 are similarly obtained on the other side of the large-scale insulating substrate 1. In electrode 3 formation, screen printing is carried out using the locations of the grooves 9 described above as reference marks. As a result, there are electrodes 3 inside the grooves 9 as well. Then, a metal glaze-type resistor paste with ruthenium oxide as its main component is printed/baked onto both side surfaces of the aforementioned large-scale insulating substrate 1 so as to contact both electrodes 3 of each pair of electrodes 3 of the unit electronic component (FIGS. 5C, 9A). Then, all the resistors 4 are covered with a glass paste, and further, a glass film 11 is obtained by screen printing/baking so as to expose the surfaces of the electrodes 3 (FIG. 5D). Then, trimming grooves 10 are formed for all the resistors 4 by laser trimming to obtain a predetermined resistance value (FIG. 5E). Then, an epoxy resin-type overcoat paste is used to cover all the aforementioned baked glass, and further, screen printing carried out so as to expose the electrodes 3 and hardened to obtain an overcoat film 12 (FIG. 5F).

Next, a process of dividing the large-scale insulating substrate 1 along the latitudinal and longitudinal grooves 9 described above into unit electronic components is carried out. Such dividing step is done by dicing using a dicing saw whose surface is covered with diamond powder. Any commercially available item can be used for the dicing saw and the dicing device. After division, the unit electronic component becomes a surface mount 2-chip type electronic component with a circuit element 2 (resistance element) formed on each surface of opposing sets of surfaces of the hexahedron insulating substrate 1, in which the electrodes 3 that make up such circuit element 2 also function as external terminals. Furthermore, the presence of electrodes 3 in the grooves 9 described above means that the electrodes 3 that also function as external terminals are also present on surfaces of the insulating substrate 1 adjacent to the surface that the circuit element 2 is present (FIG. 9B). The dimensions are approximately 0.5 mm×0.6 mm×0.3 mm.

Then, multiple unit electronic components are placed in a barrel plating device, where the tops of the electrodes 3 are coated first with a nickel plate layer 6 and then a solder plate layer 7. FIG. 5G shows a sectional view of a resistance element formed by the process described above.

Each of the surface mount 2-chip resistors obtained by the process described above is wrapped in taping, and after that, the surface mount 2-chip resistors is mounted on a circuit board 14 on which cream solder is disposed at predetermined positions by any commercially available mounting device. And, the mounting of the surface mount 2-chip resistors, shown in FIG. 7A, is obtained by the reflow process. The solder fillet 15 is formed between the electrodes 3 on the side of the insulating substrate 1 and the circuit board 14. With the so-called side fillet mounting shown in FIG. 7A, there is the advantage that scanning of the condition of the solder is easy. It should be noted that an external view of the mounting of the surface mount 4-chip resistor shown in FIG. 8 obtained by the same manufacturing steps as those of the surface mount 2-chip resistor of the present embodiment after going through the same reflow process as that of the present embodiment is shown in FIG. 7B.

In the present embodiment, the dividing step is accomplished by dicing. It is possible to divide the large-scale insulating substrate 1 by applying stress in a direction to open the grooves 9 formed in both side surfaces of the large-scale insulating substrate 1. However, considering the effect on the dimensional accuracy of the divided electronic components, dicing, with its superior dividing location accuracy, is preferable. Particularly in the case of small-scale electronic components, dimensional accuracy is very important, and the adoption of dicing is particularly preferable.

In addition, in the present embodiment, alumina ceramic is used for the large-scale insulating substrate 1 and metal glaze or glass is used for the electrodes 3 and the resistors 4 that comprise the resistance elements. However, all or some of these materials may be replaced by substances having resin as their main component. For example, in place of alumina ceramic, it is possible to use aluminum nitride or silicon nitride ceramic, with their high thermal conductivity and capable of high efficiency emanation of the Joule heat from both side surfaces of the insulating substrate 1. Also, a fiber-reinforced plastic substrate may be used in place of the ceramic substrate, electrically conductive resin electrodes containing Ag powder and epoxy-type or acryl-type resin may be used in place of the metal glaze-type Ag—Pd electrodes, and resistors composed of carbon material powder and epoxy-type resin may be used in place of the metal glaze-type resistors having ruthenium oxide as their main component. Using resin-type material enables materials costs to be reduced, and further, allows the temperature during paste curing to be lowered, thus making it possible to control resistance value drift and reduce thermal energy costs.

In addition, although in the present embodiment a description is given of a surface mount 2-chip resistor, in the present invention 4-chip, 8-chip and 16-chip resistors of the present invention are obtained using the same manufacturing steps as those of the present embodiment, specifically, by varying the number of circuit elements 2 demarcated by the dividing groove 9. Also, it is possible to manufacture the surface mount 2-chip condenser of the present invention, for example in a case in which the condenser element in section is a structure like that shown in FIG. 4 in accordance with the present embodiment. In that case, the trimming step (see FIG. 5E) and the like are not needed. In addition, the process is the same, for example, when the condenser element in section like shown in FIG. 6 has a structure that sandwiches the dielectric 5 between electrode films 3. In that case, there is a difference with the present embodiment that a screen printing step of printing one electrode 3, the dielectric 5 and the other electrode 3 as shown in the diagram, in that order, is carried out. In this instance, too, the trimming step (FIG. 5E) is not needed.

Figure 6:
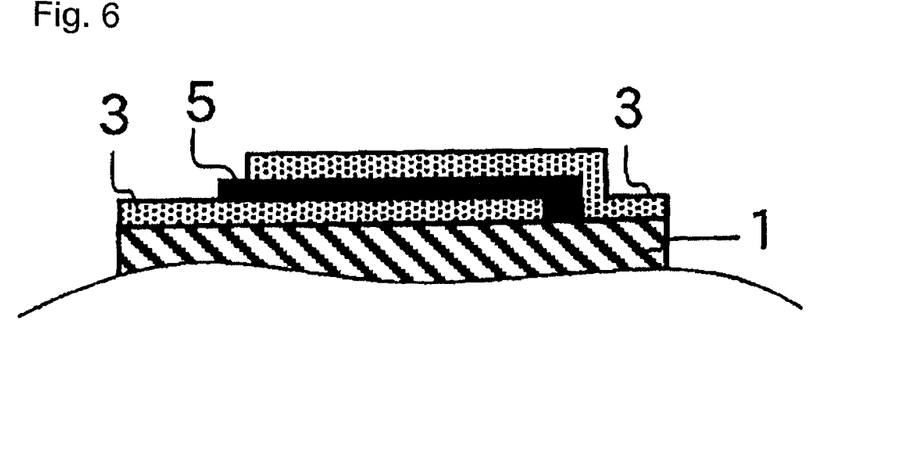
FIG. 6 is a sectional view of an example of a condenser element portion of a surface mount chip condenser of the present invention.

Obtaining the surface mount 4-chip condenser is achieved, for example, by replacing the two resistors 4 arranged on one surface of the insulating substrate 1 shown in FIG. 8 with dielectrics 5, or by replacing the two resistance elements with the condenser elements shown in FIG. 6. In the latter case, the two condenser elements can be connected by a shared electrode 17 as shown in FIG. 8. Moreover, obtaining the surface mount CR composite component of the present invention is achieved, for example, by replacing one of the two resistors arranged on one surface of the insulating substrate 1 shown in FIG. 8 with the dielectric 5, or by replacing one of the two resistance elements with the condenser element shown in FIG. 6.

In addition, although in the present embodiment the resistor 4 is formed after the electrodes 3 on top of the insulating substrate 1, it is possible to form the electrodes 3 after the resistor 4. Doing so makes it possible to achieve the arrangement of the resistor 4 and the electrodes 3 shown in FIG. 4A described above.

The present invention can be used in an industry relating to surface mount composite electronic components.

What is claimed is:

1. A surface mount composite electronic component, comprising:
    an insulating substrate composed of a hexahedron; a circuit element formed on each surface of a pair of opposed surfaces of the insulating substrate, the opposed surfaces disposed on lateral side surfaces of the insulating substrate, the lateral side surfaces being adjacent to top and bottom surfaces of the insulating substrate, the top and bottom surfaces having the largest surface areas of the insulating substrate, the circuit element on each of the opposed surfaces comprising electrodes formed on the respective surfaces of the insulating substrate that the electrodes also functioning as external terminals on the opposed surfaces of the insulating substrate; wherein the circuit element is composed of electrodes as well as resistor forming material or capacitor forming material that contact said electrodes, a nickel plate layer and a solder plate layer laid down, in that order, on the surfaces of external terminal areas of said electrodes.

2. The surface mount composite electronic component according to claim 1, wherein one surface of the insulating substrate is substantially perpendicular to an adjacent surface.

3. The surface mount composite electronic component according to claim 1, having an area in which no electrodes are present on an edge portion of the surface of the insulating substrate on which said external terminals are present, disposed perpendicular to a straight line connecting a pair of external terminals electrically connected to one circuit element.

4. The surface mount composite electronic component according to claim 1, having an area in which the electrodes and the resistor overlap and contact each other on the surface of the insulating substrate, the resistor disposed on the insulating substrate in said area, and further, the electrodes laid on the resistor.

5. The surface mount composite electronic component according to claim 1, wherein a relation between an insulating substrate dimension (L) in a direction of flow of electric current of the circuit element of the insulating substrate surface on which circuit elements are formed, an insulating substrate dimension (T) perpendicular to L, and a distance (W) between surfaces of the insulating substrate on which the circuit elements are formed is $L \geq W > T$.

6. The surface mount composite electronic component according to claim 1, wherein the electrodes that also function as external terminals are also present on a surface of the insulating substrate adjacent to the surface of the insulating substrate on which the circuit elements are present.

7. A surface mount composite electronic component, comprising:

a pair of first electrodes disposed on both ends of a front surface of an insulating substrate composed of a hexahedron and a first shared electrode disposed on the front surface of the insulating substrate between and separate from said first electrodes;

a pair of second electrodes disposed on both ends of a rear surface of the insulating substrate opposite the first electrodes and a second shared electrode disposed on the rear surface of the insulating substrate between and separate from said second electrodes;

the front and rear surfaces being adjacent to top and bottom surfaces of the insulating substrate, the top and bottoms surfaces having the largest surface areas of the insulating substrate, two first resistors disposed on the front surface of the insulating substrate so as to contact the first pair of electrodes and the first shared electrode; and two second resistors disposed on the rear surface of the insulating substrate so as to contact the second pair of electrodes and the second shared electrode.

8. The surface mount composite electronic component according to claim 7, wherein the number of external terminals is six.

9. The surface mount composite electronic component according to claim 7, wherein the circuit element is composed of electrodes as well as resistors or dielectrics that contact said electrodes, a nickel plate layer and a solder plate layer laid down, in that order, on the surfaces of external terminal areas of said electrodes.

10. The surface mount composite electronic component according to claim 7, wherein one surface of the insulating substrate is substantially perpendicular to an adjacent surface.

11. The surface mount composite electronic component according to claim 7, having an area in which no electrodes are present on an edge portion of the surface of the insulating substrate on which said external terminals are present, disposed perpendicular to a straight line connecting a pair of external terminals electrically connected to one circuit element.

12. The surface mount composite electronic component according to claim 7, having an area in which the electrodes and the resistor overlap and contact each other on the surface of the insulating substrate, the resistor disposed on the insulating substrate in said area, and further, the electrodes laid on the resistor.

13. The surface mount composite electronic component according to claim 7, wherein a relation between an insulating substrate dimension (L) in a direction of flow of electric current of the circuit element of the insulating substrate surface on which circuit elements are formed, an insulating substrate dimension (T) perpendicular to L, and a distance (W) between surfaces of the insulating substrate on which the circuit elements are formed is $L \geq W > T$.

14. The surface mount composite electronic component according to claim 7, wherein the electrodes that also function as external terminals are also present on a surface of the insulating substrate adjacent to the surface of the insulating substrate on which the circuit elements are present.

* * * * *